United States Patent [19]
Liang

[11] Patent Number: 5,959,838
[45] Date of Patent: Sep. 28, 1999

[54] STRUCTURE OF A CPU RADIATOR

[76] Inventor: Robert Liang, No. 28, YangHsiang Rd., YangMei, Taoyuan, Taiwan

[21] Appl. No.: 09/222,433

[22] Filed: Dec. 28, 1998

[51] Int. Cl.⁶ .................................................. H05K 7/20
[52] U.S. Cl. ...................... 361/697; 361/695; 361/697; 361/704; 361/707; 361/710; 361/722; 165/80.3; 165/121; 165/185; 174/16.3; 257/718; 257/719
[58] Field of Search ..................... 361/695, 697, 361/704, 707–710, 712–720; 165/80.2, 80.3, 121, 185; 29/832; 257/706–723; 174/16.3

[56] References Cited

U.S. PATENT DOCUMENTS 5,579,827   12/1996   Chung ..................................... 165/80.3
5,603,374   2/1997   Wu .

FOREIGN PATENT DOCUMENTS 246982   11/1994   Taiwan ............................. G06F 1/20

Primary Examiner—Leo P. Picard
Assistant Examiner—Michael Datskovsky

[57] ABSTRACT

An improvement of the structure of a CPU radiator comprises a radiating structure and a fixing seat. The radiating structure is combined with a heat conducting plate projected from the radiating structure. The fixing seat has a hole for being passed by the heat conducting plate. One surface of the fixing seat near the edge of the hole being installed with convex elements on the two opposite sides. After the heat conducting plate has passed through the hole of the fixing seat, the radiating structure is rotated with respect to the fixing seat so that the edge of the heat conducting plate slides upwards along the convex elements. Thus, the fixing seat and the radiating structure are tightly fixed, and then it is buckled on the edge of the CPU by the hooks.

6 Claims, 7 Drawing Sheets

STRUCTURE OF A CPU RADIATOR

FIELD OF THE INVENTION

The present invention relates to an improvement of the structure about the radiator of a central processing unit (CPU), thereby, the assembly of the CPU and the radiator becomes easier and faster.

BACKGROUND OF THE INVENTION

In the prior art, the central processing unit (CPU) of a computer will cause a high temperature environment as it is started to operate. If the heat due to the high temperature can not be dissipated, then the performance will be effected, even it will be burnt. Moreover, the higher the operation speed, the more heat it will generate. Therefore, any computer mainframe must be installed with radiator for dissipating the heat from the chipset.

In general, CPU with faster operation speed are designed with radiators. Wherein a radiator with a plurality of fins is directly installed on a CPU, even a fan is installed on the radiator. Most of heat induced from the operation of a CPU is absorbed by the radiator. When the chip set is operating, the fan is actuated concurrently to blow the fins. Thus, the heat is dissipated. Conventionally, the way for assembling the radiator on a CPU is to engage a radiator to the socket of a CPU by a metal elastic piece (for example, Taiwan Patent Publication No. 246982). However, the conventional metal elastic piece for engaging a radiator to a CPU has a complicated structure. Thus it is inconvenient to be assembled, an elastic fatigue occurs easily, also a high manufacture cost is required. Therefore, the structure is loosen easily as the computer is transported. If a larger force due to a careless operation is applied, the precise and weak CPU will be damaged.

Another way for engaging a CPU and a radiator is to use screws (for example, U.S. Pat. No. 5,603,374, as shown in FIG. 8). In general, in this assembly way, a radiating fan is further assembled. However, several screws are used to fix the fan, thus the efficiency is low. Further, the holes of the radiating fan, radiating fins, and CPU fixing seat must be aligned exactly in order to be locked by screws. Once a pair of holes do not align with each other, the screw will not be locked. Thus the prior art design has a lower yield ratio and a high cost. Therefore, a novel design is necessary to improve the defect in the prior art.

SUMMARY OF THE INVENTION

The primary object of the present invention is to provide an improvement of the structure of a CPU radiator, by which the radiating structure and the fixing seat can be easily and efficiently assembled.

Accordingly, the present invention provides an improvement about the structure of a CPU radiator comprising a radiating structure and a fixing seat. The radiating structure is combined with a heat conducting plate projected from the radiating structure. The fixing seat has a hole for being passed by the heat conducting plate. One surface of the fixing seat near the edge of the hole being installed with convex elements on the two opposite sides. After the heat conducting plate has passed through the hole of the fixing seat, the radiating structure is rotated with respective to the fixing seat so that the edge of the heat conducting plate slides upwards along the convex elements. Thus, the fixing seat and the radiating structure is tightly fixed, and then it is buckled on the edge of the CPU by the hooks.

The various objects and advantages of the present invention will be more readily understood from the following detailed description when read in conjunction with the appended drawing.

DETAILED DESCRIPTION OF THE PREFERRED EMBODIMENTS

Figure 1:
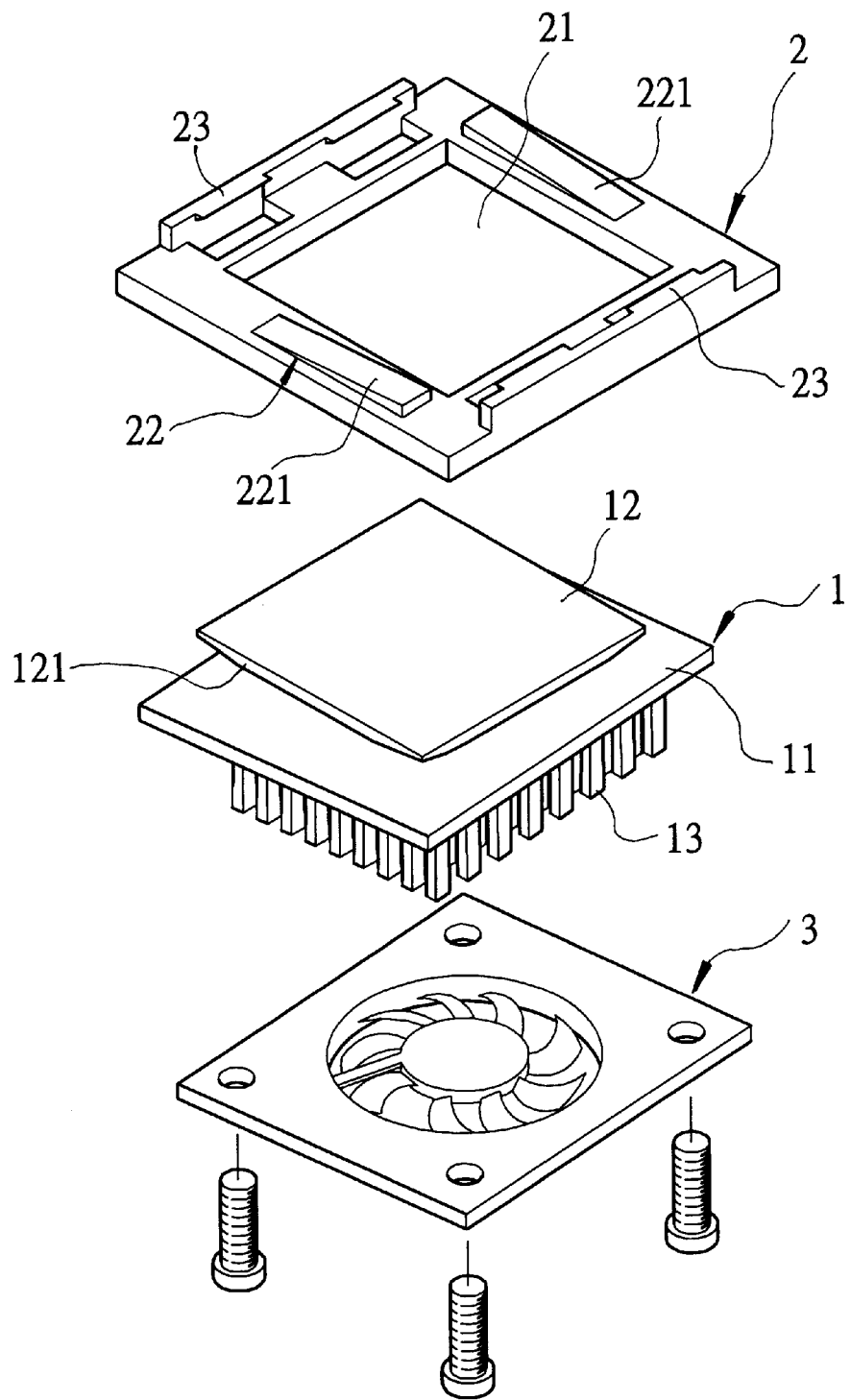
FIG. 1 is an exploded perspective view showing the relation of the components of the present invention.
Figure 5:
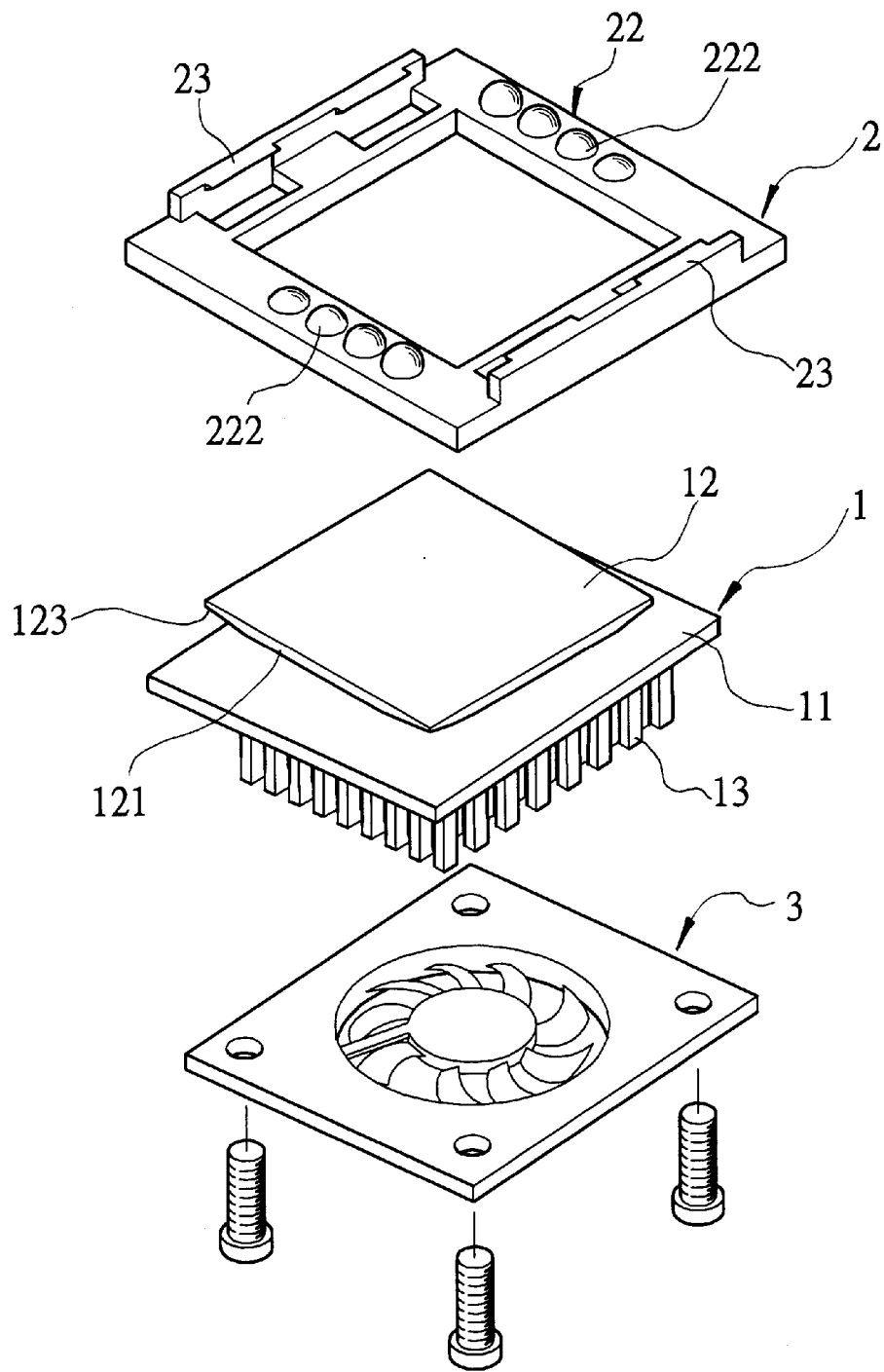
FIG. 5 is an exploded perspective view of another embodiment of the present invention.
Figure 6:
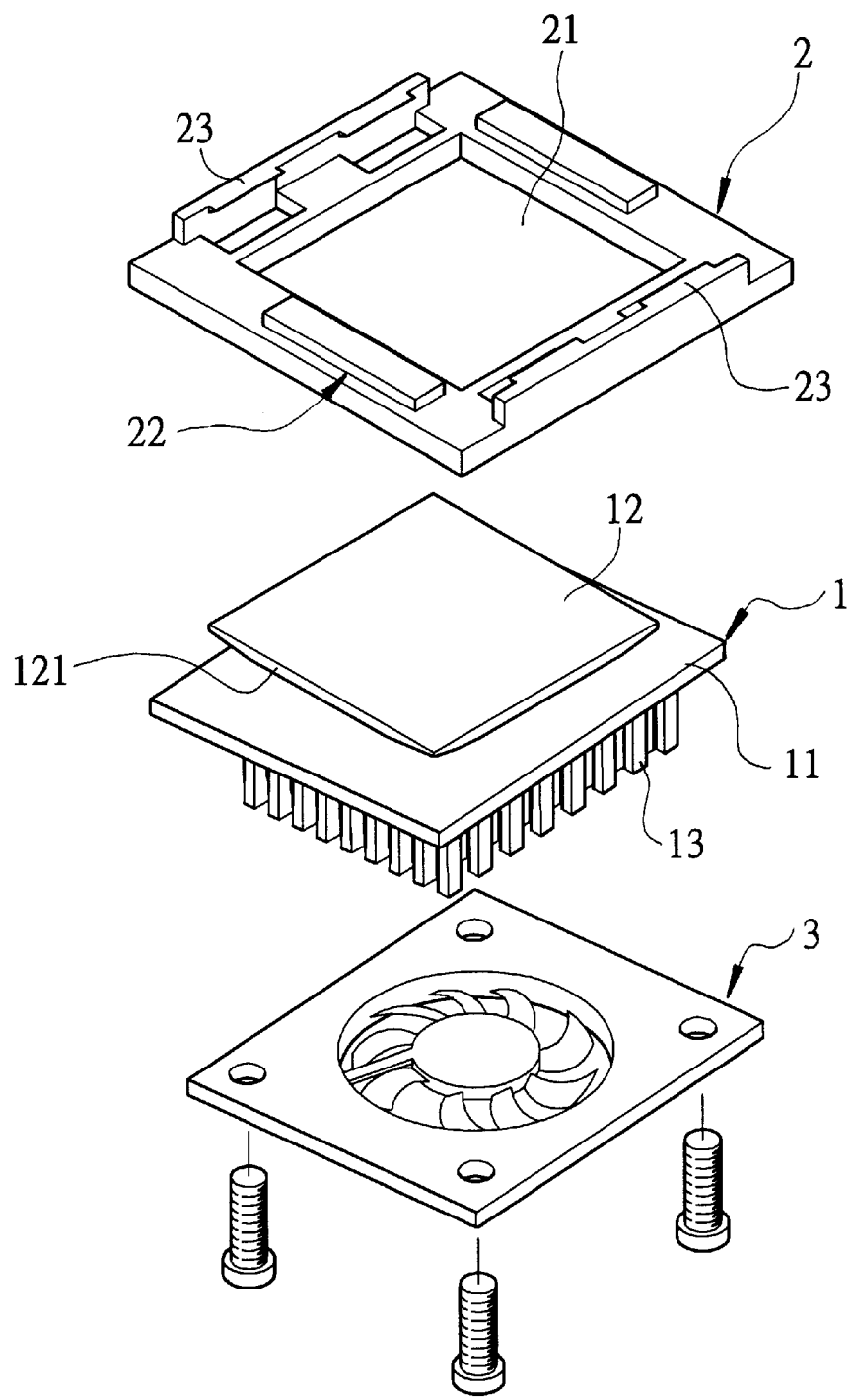
FIG. 6 is an exploded perspective view of a further embodiment of the present invention.
Figure 7:
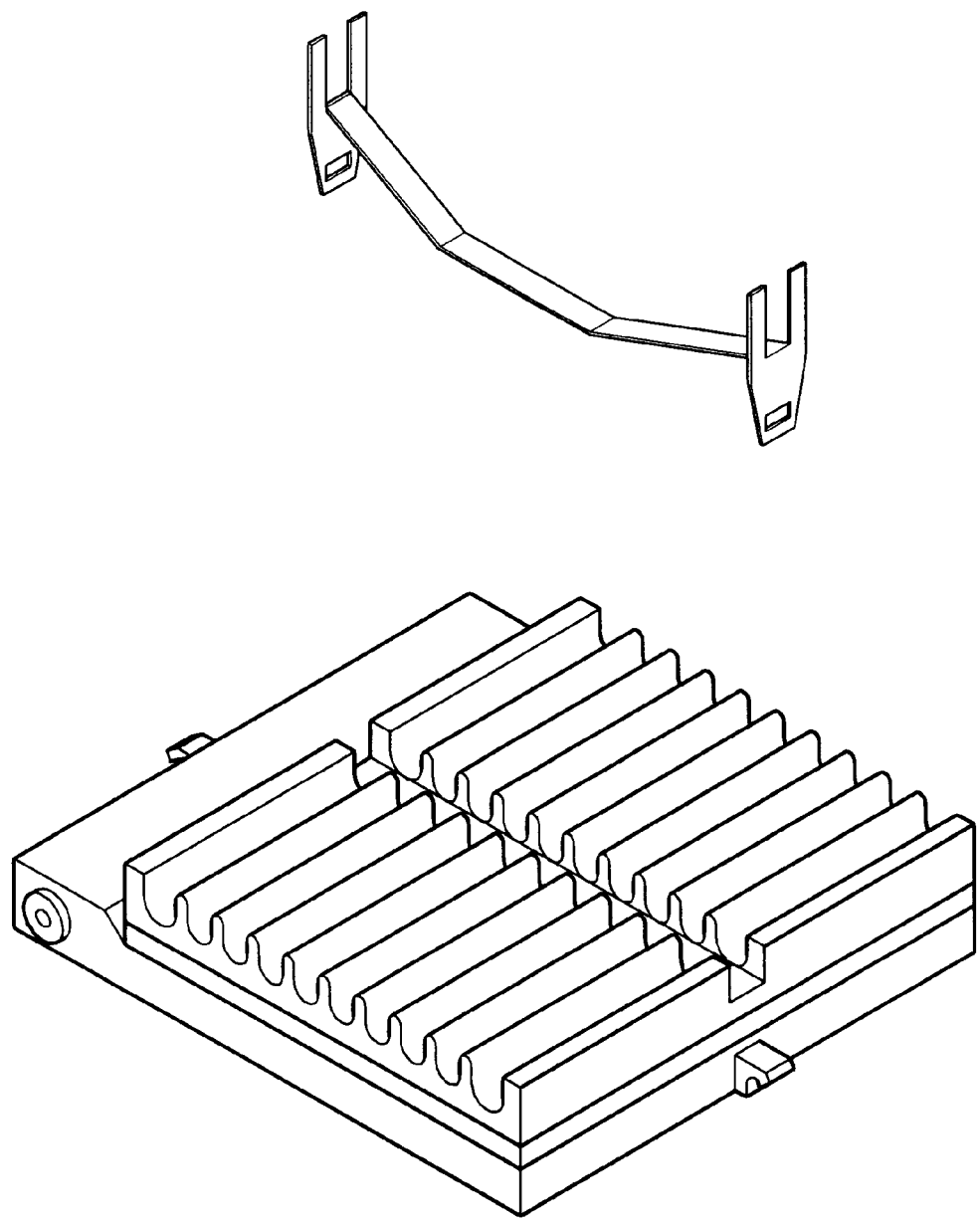
FIG. 7 is an exploded perspective view of a prior art CPU radiator.
Figure 8:
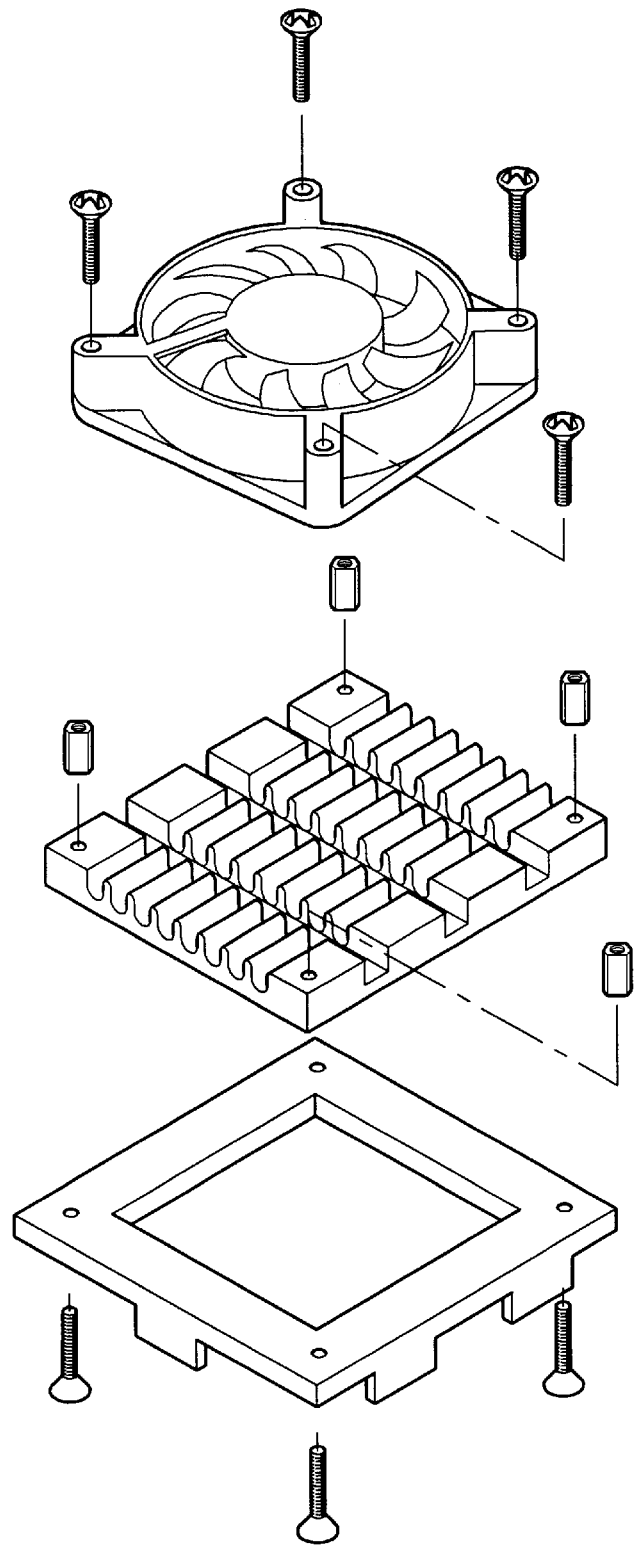
FIG. 8 is an exploded perspective view of another prior art CPU radiator.

With reference now to FIG. 1, the improvement about the structure of a CPU radiator in the present invention includes a radiating structure 1, a fixing seat 2, and a fan 3. In the radiating structure, a plurality of heat dissipating fins 13 are installed on one surface of the radiator body 11. Another surface of the radiator body 11 is integrally formed with a heat conducting plate 12. The heat conducting plate 12 and the radiator body 11 are connected by a linkage 122 the outer diameter of which is wider than the width of the heat conducting plate 12 so that the heat conducting plate 12 may project from the radiator body 11 and to cause that a proper distance is retained between the edge 121 of the heat conducting plate 12 and the radiator body 11. Further, an inclined plane 123 is formed on the lower end of the edge 121. Further, from the elevation view, the heat conducting plate 12 and the body 11 of the radiating structure 1 are formed with a proper angle. The fixing seat 2 is formed with a hole 21 for being passed through by the heat conducting plate 12. One surface of the fixing seat 2 near the edge of the hole 21 is installed with convex elements 22 on the two opposite sides. In one embodiment, the convex elements 22 has a wedge shape and the inclined surfaces of the two wedges have opposite orientations. In another embodiment, the convex elements 22 are formed by a plurality of round or block nose positions 222 which are arranged by increasing sizes (as shown in FIG. 5). In a further embodiment, the convex elements 22 are formed by blocks with a flat upper surface (as shown in FIG. 6). A plurality of hooks 23 are installed on the periphery of the fixing seat 2. The fan 3 is screwedly locked on the radiating structure 1.

Figure 2:
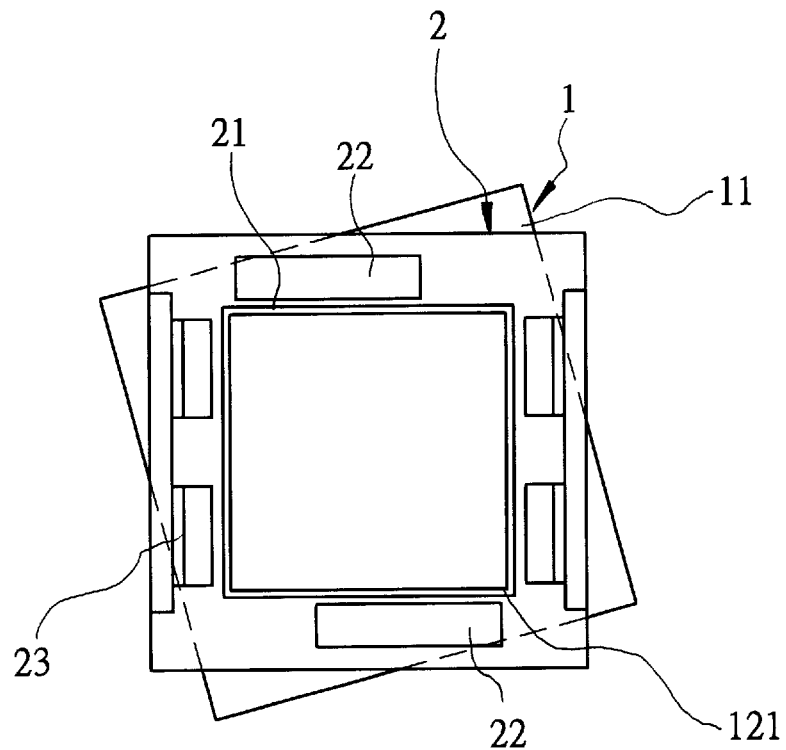
FIG. 2 is a front plan view showing an assembly view of the radiating fin and the fixing seat before rotating.
Figure 3:
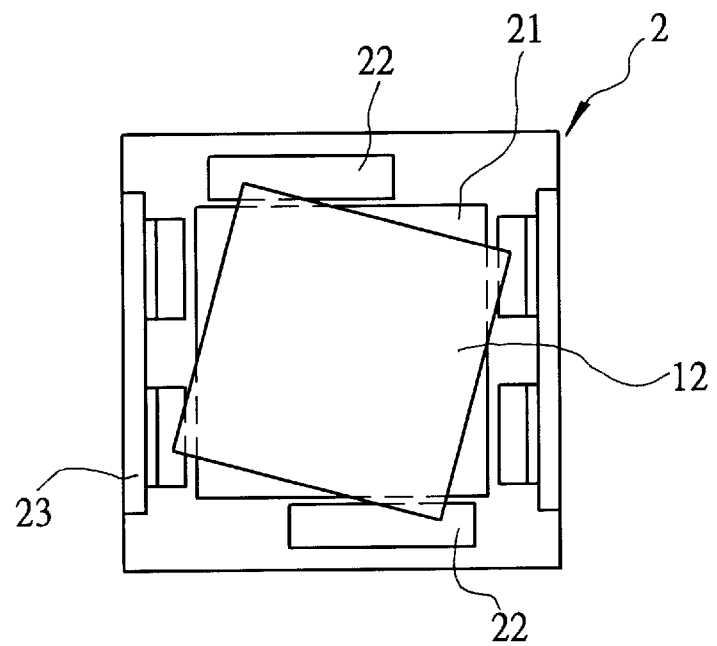
FIG. 3 is a front plan view showing an assembly view of the radiating fin and the fixing seat after rotating.
Figure 4:
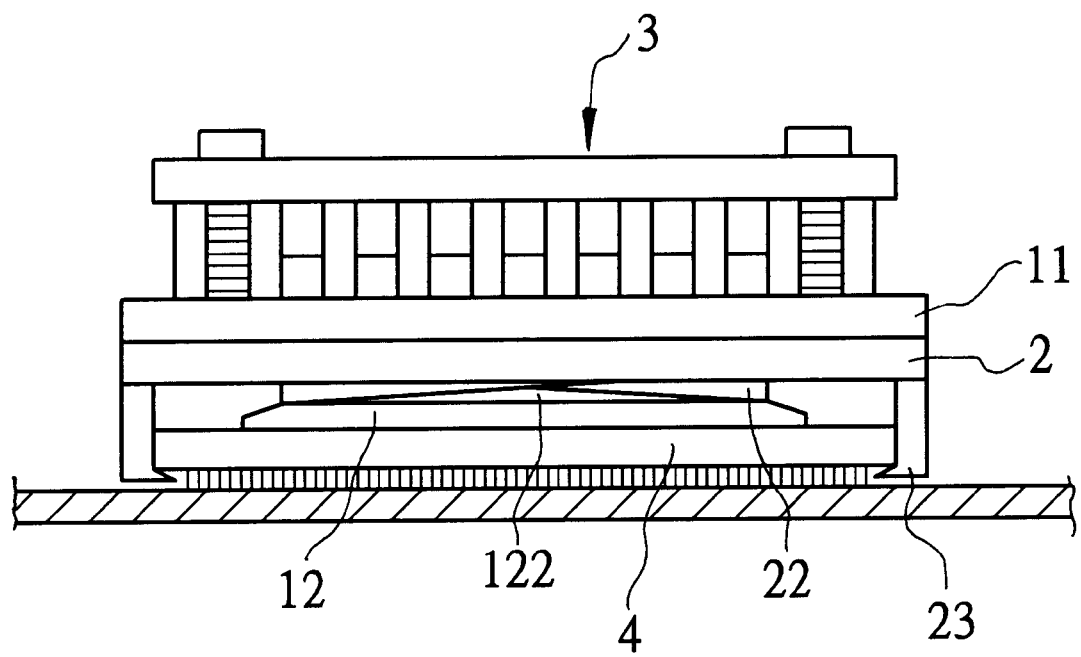
FIG. 4 is a front plan view showing an assembly view of the radiating fin and the fixing seat before rotating, wherein the assembly body is fixed on a CPU.

By the aforementioned structure, in assembly, after the heat conducting plate 12 has passed through the hole 21 of the fixing seat 2 (as shown in FIG. 2), the radiating structure 1 is rotated with respective to the fixing seat 2 so that the edge 121 of the heat conducting plate 12 slides upwards along the convex elements 22 of the wedges 221. Thus, the fixing seat 2 and the radiating structure 1 can be tightly fixed (as shown in FIGS. 3 and 4); or the edge 121 of the heat conducting plate 12 slides upwards along the smallest convex noise portion 222 to tightly fixed the fixing seat 2 and the radiating structure 1; or by the inclined surface 123 of the heat conducting plate 12, the radiating structure 1 will slide upwards along the flat blocks, then it can be buckled on the edge of he CPU by the hooks 23. The assembly speed of the whole structure are rapidly and the efficiency of assembly is quickly.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A structure of a CPU radiator comprising:

a radiating structure combining with a heat conducting plate projected from the radiating structure so that a proper distance is retained between an edge of the heat conducting plate and the radiator structure, and the lower portion of the heat conducting plate being formed with an inclined surface;

a fixing seat with a hole for being passed by the heat conducting plate, one surface of the fixing seat near the edge of the hole being installed with convex elements on the two opposite sides, the inclined edges of the two convex elements having opposite orientations, and the fixing seat being installed with a plurality of hooks;

a fan installed on the radiating structure;

wherein after the heat conducting plate has passed through the hole of the fixing seat, the radiating structure is rotated with respect to the fixing seat so that the edge of the heat conducting plate slides upwards along the convex elements, thus, the fixing seat and the radiating structure is tightly fixed, and then it is buckled on the edge of the CPU by the hooks.

2. The structure of a CPU radiator as claimed in claim 1, wherein the convex elements are wedge shape blocks.

3. The structure of a CPU radiator as claimed in claim 1, wherein the convex elements are formed by a plurality of convex portions arranged from smaller size to larger sizes.

4. The structure of a CPU radiator as claimed in claim 1, wherein the convex elements are blocks with flat upper surface.

5. The structure of a CPU radiator as claimed in claim 1, where the heat conducting plate and the radiating structure are formed as an integral body.

6. The structure of a CPU radiator as claimed in claim 1, wherein from the elevation view, the heat conducting plate is inclined with respect to the radiator structure so that after the heat conducting plate is tightly engaged with the convex elements of the fixing seat, the radiator structure and the fixing seat are aligned with each other.

\* \* \* \* \*